(12) United States Patent
Kim et al.

(10) Patent No.: US 6,521,959 B2
(45) Date of Patent: Feb. 18, 2003

(54) SOI SEMICONDUCTOR INTEGRATED CIRCUIT FOR ELIMINATING FLOATING BODY EFFECTS IN SOI MOSFETS AND METHOD OF FABRICATING THE SAME

(75) Inventors: Young-Wug Kim, Suwon (KR); Byung-Sun Kim, Suwon (KR); Hee-Sung Kang, Sungnam-shi (KR); Young-Gun Ko, Sungpa-ku (KR); Sung-Dae Park, Kunpo (KR); Min-Su Kim, Kyunggi-do (KR); Kwang-Il Kim, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 129 days.

(21) Appl. No.: 09/782,116

(22) Filed: Feb. 13, 2001

(65) Prior Publication Data

US 2001/0031518 A1 Oct. 18, 2001

Related U.S. Application Data

(63) Continuation-in-part of application No. 09/695,341, filed on Oct. 24, 2000.
(60) Provisional application No. 60/161,479, filed on Oct. 25, 1999.

(51) Int. Cl.$^7$ ............................................... H01L 29/72
(52) U.S. Cl. ..................... 257/397; 257/510; 257/513; 257/514
(58) Field of Search ............................ 257/397, 347, 257/510, 515, 514, 513, 52, 408, 288, 236, 396, 398, 400, 344; 438/221, 300, 296, 297

(56) References Cited

U.S. PATENT DOCUMENTS

| | | | | |
|---|---|---|---|---|
| 4,635,347 A | * | 1/1987 | Lien et al. | 148/DIG. 147 |
| 5,286,667 A | * | 2/1994 | Lin et al. | 438/253 |
| 5,623,155 A | | 4/1997 | Kerber et al. | 257/347 |
| 5,719,079 A | * | 2/1998 | Yoo et al. | 148/DIG. 19 |
| 5,723,893 A | * | 3/1998 | Yu et al. | 257/316 |
| 5,729,039 A | | 3/1998 | Beyer et al. | 257/347 |
| 5,757,045 A | * | 5/1998 | Tsai et al. | 257/336 |
| 5,949,116 A | * | 9/1999 | Wen | 257/236 |
| 5,973,364 A | | 10/1999 | Kawanaka | 257/347 |
| 5,998,252 A | * | 12/1999 | Huang | 438/241 |
| 6,004,829 A | * | 12/1999 | Chang et al. | 438/16 |
| 6,013,943 A | * | 1/2000 | Cathey et al. | 257/607 |
| 6,025,267 A | * | 2/2000 | Pey et al. | 438/299 |
| 6,294,817 B1 | * | 9/2001 | Srinivasan et al. | 257/347 |
| 6,306,693 B1 | * | 10/2001 | Ishiguro et al. | 438/149 |
| 6,348,389 B1 | * | 2/2002 | Chou et al. | 438/305 |

FOREIGN PATENT DOCUMENTS

JP   2001223276   * 8/2001

OTHER PUBLICATIONS

Assaderaghi, Fariborz, "Dynamic Threshold Voltage MOS-FET (DTMOS) for Very Low Voltage Operation," IEEE Electron Device Letters, v 15 n 12, Dec. 1994, p. 510–512.
Sleight, Jeffrey W., "DC and Transient Characterization of a Compact Schottky Body Technology for SOI Trnsistors," IEEE Transactions on Electron Devices, v 46 n 7, 1999, p. 1451–1456.

* cited by examiner

Primary Examiner—Tuan H. Nguyen
Assistant Examiner—Laura M Schillinger
(74) Attorney, Agent, or Firm—Mills & Onello LLP

(57) ABSTRACT

A silicon-on-insulator (SOI) integrated circuit and a method of fabricating the SOI integrated circuit are provided. At least one isolated transistor active region and a body line are formed on an SOI substrate. The transistor active region and the body line are surrounded by an isolation layer which is in contact with a buried insulating layer of the SOI substrate. A portion of the sidewall of the transistor active region is extended to the body line. Thus, the transistor active region is electrically connected to the body line through a body extension. The body extension is covered with a body insulating layer. An insulated gate pattern is formed over the transistor active region, and one end of the gate pattern is overlapped with the body insulating layer.

8 Claims, 22 Drawing Sheets

SOI SEMICONDUCTOR INTEGRATED CIRCUIT FOR ELIMINATING FLOATING BODY EFFECTS IN SOI MOSFETS AND METHOD OF FABRICATING THE SAME

RELATED APPLICATION

This application is a continuation-in-part (CIP) of application Ser. No. 09/695,341 filed Oct. 24, 2000 pending, and claims benefit of No. 60/161,479, filed Oct. 25, 1999, and assigned to the assignee of the present application, the disclosure of which is hereby incorporated herein by reference in its entirety.

FIELD OF THE INVENTION

The present invention generally relates to silicon-on-insulator (SOI) technology, and more particularly to an SOI semiconductor integrated circuit for eliminating floating body effects in SOI MOSFETs and a method of fabricating the same.

DESCRIPTION OF THE RELATED ART

In the semiconductor manufacturing industry, there has been a great deal of attention paid to reducing parasitic capacitance and resistance to increase the operating speed of semiconductor integrated circuits. SOI MOSFETs have been demonstrated to be superior to bulk silicon MOSFETs in terms of low power, high speed very large scale integration (VLSI) applications because of their inherent merits such as less junction capacitance and better device isolation. In addition, there are many advantages in SOI devices such as better immunity to soft errors, reduction in dynamic power, improvement in latch-up resistance even with increased packing density. Despite the above outstanding features of SOI devices, SOI integrated circuits have suffered some lack of commercial success due to technical problems in material processing and device design.

FIG. 1 depicts a typical structure of an SOI MOSFET according to the prior art. The SOI MOSFET includes a gate electrode 20, a gate dielectric 21 a source 23 and drain 24 on insulating layer 15. A backside surface of the insulating layer 15 is in contact with a supporting substrate 10.

Since the body region 30 of the SOI MOSFET is isolated by the insulating layer 15, it is electrically isolated and therefore its voltage varies with the voltage applied to either source region 23, drain region 24, or gate electrode 20.

The voltage fluctuation of the body region 30 in SOI MOSFET, commonly referred to as the floating body effect (FBE), causes detrimental effects for the proper operation of SOI devices. The most common of these detrimental effects are the kink effect and the bipolar effect. With the channel region of the device partially depleted and a high drain voltage applied, the electric field created in the device causes impact ionization near the drain region 24.

Accordingly, in the event that the SOI MOSFET is an SOI N-MOSFET, the generated holes are injected into the body thereby creating a positively charged body. The first consequence of this positive charge accumulated in the body 30 is the increase of the body potential resulting in a decrease of the threshold voltage ($V_T$) of the SOI MOSFET. Since the decrease of the threshold voltage raises the drain current, the variation of threshold voltage shows up as kinks in the output characteristics of the SOI MOSFETs.

Another consequence of the voltage increase is the eventual turn-on of the lateral bipolar structure since the MOSFET includes a lateral bipolar transistor, i.e., the n-p-n construction 23, 30, and 24. As the body 30 of the MOSFET becomes positively biased, the source-body (23-30) junction, corresponding to emitter-base junction of the lateral n-p-n construction, becomes forward biased, and electrons are injected from the source 23 into the body region 30. The injected electrons reaching the drain depletion region add to the drain current. Consequently, the drain current is dominantly controlled by the parasitic bipolar transistor rather than by the channel current under the gate electrode control. This effect is referred to as the parasitic "bipolar" effect. The parasitic bipolar action of the SOI MOSFET induces a "dynamic leakage current" (DLC) especially in a switching circuit.

In a MUX (multiplexer) circuit as depicted in FIG. 2A, if the applied voltages at nodes A and B are high, then the output node C will be high. If the gate voltage of the node A is switched to a low voltage, then the output node C should be kept to a high voltage. However, in a state that the nodes A and C keep a low voltage and a high voltage, respectively, if the voltage at node B is switched to a low voltage for some reason, the output voltage at node C drops instantaneously by the dynamic leakage mechanism due to the parasitic bipolar effect. FIG. 2B illustrates the instantaneous drop of the output voltage at node C in the multiplexer circuit according to the prior art. Here, the x-axis represents time (t) and the y-axis represents voltage of the node C.

In order to remedy those detrimental effects due to the floating body effect observed in SOI MOSFETs, several technical approaches have been proposed. For instance, F. Assaderaghi et al. proposed a technique for reducing the floating body effect in their technical paper entitled, "A dynamic threshold voltage MOSFET (DTMOS) for very low voltage operation," published in IEEE Electron Device Lett., pp.510–512, Vol.15, No.12, 1994. F. Assaderaghi et al. tried to eliminate the floating body effect by tying the floating body to the gate of the SOI MOSFET. However, since the dynamic leakage current cannot be avoided between source and drain when the gate voltage is high while keeping source and drain low, they pointed out that their approach is only applicable to the low voltage operation.

As another approach to resolve the floating body problem in SOI devices, J. W. Sleight et al. proposed a Schottky body contact technology in a technical paper entitled, "DC and transient characterization of a compact Schottky body contact technology for SOI transistors," published in IEEE Transactions on Electron Devices, pp.1451–1456, Vol.46, No.7, July 1999. This technical paper provides a self-aligned Schottky diode method for body contacting partially depleted SOI transistors. In their paper, Schottky diodes are placed at source/drain terminals, allowing the floating body to be tied to the source/drain region.

FIGS. 3A and 3B are schematic layout diagrams for implementing body contact tied to source/drain and gate, respectively, according to the prior art. Referring to FIG. 3A, n$^+$ source 23 is tied to the body 30 through p$^+$ regions 31. Referring to FIG. 3B illustrating the gate-body contact in accordance with the first prior art paper mentioned above, the body 30 is electrically connected to the gate electrode 20 through electrical contact 33.

However, it should be noted that the body contacting schemes either to source or gate disclosed in the prior art have fundamental limitations in their application to commercial SOI integrated circuits. Namely, since only the weak parts vulnerable to the dynamic leakage current out of the whole circuit are manually cured by contacting the floating body according to the prior art, it is difficult to resolve the inherent floating body problem in SOI integrated circuits.

For instance, only 50 to 100 thousand transistors are usually body-contacted to remedy the floating body effect out of 1.5 million transistors comprising the 64-bit microprocessor fabricated on SOI substrate.

SUMMARY OF THE INVENTION

In view of these problems, there is need for a method and structure for fundamentally eliminating the floating body effect in SOI semiconductor integrated circuits, which is not subject to these limitations.

Accordingly, it is an object of the present invention to provide a technique to eliminate the floating body effect in SOI integrated circuits. It is another object of the present invention to provide a technique to resolve the kink effect in SOI integrated circuits.

It is another object of the present invention to provide a technique to eliminate the parasitic bipolar effect and consequently the dynamic leakage current in SOI integrated circuits.

It is another object of the present invention to provide a technique to eliminate the floating body effect, which is applicable to commercial SOI products.

It is another object of the present invention to provide a complete solution to eliminate the floating body effect while keeping the conventional layout compatibility.

Accordingly, the invention is directed to a SOI semiconductor integrated circuit and a method of making the same. The SOI integrated circuit of the invention is formed on an SOI substrate including a supporting substrate, a buried insulating layer on the supporting substrate and a semiconductor layer of a first conductivity type on the buried insulating layer. The SOI integrated circuit of the invention includes at least one isolated transistor active region including a predetermined region of the semiconductor layer. A body line of the first conductivity type is disposed at one side of the transistor active region, the body line including a portion of the semiconductor layer. An isolation layer surrounds sidewalls of the transistor active region and the body line, the isolation layer being in contact with the buried insulating layer. A body extension of the first conductivity type extends from a predetermined sidewall of the transistor active region and is connected to the body line, the body extension being thinner than the transistor active region. A body insulating layer is formed on the body extension. An insulated gate pattern crosses over the transistor active region, the insulated gate pattern overlapping with the body insulating layer.

In accordance with the present invention, provided are SOI semiconductor integrated circuits having a body extension which connects a body region of an SOI MOSFET to a body line tied to the power line or the ground line and methods of fabricating the SOI semiconductor integrated circuits.

An SOI integrated circuit according to an embodiment of the present invention comprises at least one isolated SOI MOSFET surrounded by insulator, a body line disposed at one side of the SOI MOSFET and a body extension which electrically connects a sidewall of a body region of the SOI MOSFET to the body line. Therefore, a plurality of SOI MOSFETs may be disposed at one side of the body line. In addition, the plurality of SOI MOSFETs may be disposed at both sides of the body line.

In one embodiment, the first conductivity type is P type. In an alternative embodiment, the first conductivity type is N type. In one embodiment, the SOI integrated circuit includes a metal silicide layer formed on the body line.

In one embodiment, a gate insulating layer is interposed between the insulated gate pattern and the transistor active region and one end of the insulated gate pattern is overlapped with the body insulating layer. The body insulating layer is thicker than the gate insulating layer. Thus, it can prevent an inversion channel from being formed at the body extension regardless of the voltage applied to the insulated gate pattern. As a result, it becomes possible to implement an improved SOI MOSFET without floating bodies in the whole SOI integrated circuits.

An SOI integrated circuit according to another embodiment of the present invention is formed on an SOI substrate including a supporting substrate, a buried insulating layer on the supporting substrate and a semiconductor layer of a first conductivity type on the buried insulating layer. The SOI integrated circuit of the invention includes at least one transistor active region and at least one body contact active region spaced apart from the transistor active region. The transistor active region and the body contact active region are composed of a portion of the semiconductor layer. The buried insulating layer, which is located between the transistor active region and the body contact active region, is covered with a semiconductor residue layer. The semiconductor residue layer is thinner than the transistor active region and the body contact active region. As a result, a partial trench region exists between the transistor active region and the body contact active region. The partial trench region is filled with a partial trench isolation layer. A full trench isolation layer is interposed between the transistor active region and the partial trench isolation layer. The full trench isolation layer is in contact with the buried insulating layer. Thus, the full trench isolation layer surrounds sidewall of the transistor active region. A body extension is extended from a portion of the sidewall of the semiconductor residue layer toward the transistor active region. The body extension connects the transistor active region to the semiconductor residue layer and is covered with the partial trench isolation layer. An insulated gate pattern crosses over the transistor active region. The body extension is overlapped with at least one end of the insulated gate pattern.

The present invention further comprises source/drain regions formed at the transistor active region, which is located at both side of the insulated gate pattern. Preferably, the source/drain regions is in contact with the buried insulating layer. Thus, the source/drain regions are surrounded the full trench isolation layer and the buried insulating layer.

The invention is also directed to a method of making a SOI semiconductor integrated circuit on an SOI substrate including a supporting substrate, a buried insulating layer on the supporting substrate and a semiconductor layer of a first conductivity type on the buried insulating layer. In accordance with the method, a predetermined region of the semiconductor layer is etched to form a trench region defining at least one isolated transistor active region and a body line active region at one side of the transistor active region and concurrently leaving a semiconductor residue layer, which is thinner than the semiconductor layer at a bottom of the trench region. The semiconductor residue layer is selectively etched until the buried insulating layer is exposed, thereby forming an isolation region and concurrently leaving a body extension of the first conductivity type connecting the transistor active region to the body line active region. A body insulating layer and an isolation layer are formed on the body extension and the exposed buried insulating layer, respectively. An insulated gate pattern is formed crossing over the transistor active region and overlapping with the body insulating layer. The body line active region is doped with impurities of the first conductivity type to form a body line.

A method of fabricating the SOI integrated circuit in accordance with the invention includes forming at least one SOI MOSFET at an SOI substrate, forming a body line disposed at one side of the SOI MOSFET and forming a body extension that electrically connects a body region of the SOI MOSFET to the body line. Here, the SOI substrate includes a supporting substrate, a buried insulating layer formed on the supporting substrate and a semiconductor layer formed on the buried insulating layer. Thus, a plurality of SOI MOSFETs may be formed at one side of the body line or at both sides of the bit line.

The method of forming the SOI MOSFET, the body line and the body extension comprises etching a predetermined region of the semiconductor layer to form a trench region defining at least one isolated transistor active region and a body line active region at one side of the transistor active region. The depth of the trench region is smaller than the thickness of the semiconductor layer. Thus, a semiconductor residue layer, which is thinner too than the semiconductor layer, exists at the bottom of the trench region. A predetermined region of the semiconductor residue layer is then selectively etched until the buried insulating layer is exposed, thereby leaving a body extension that connects the transistor active region to the body line. Accordingly, an isolation region exposing the buried insulating layer is formed. As a result, the isolation region is deeper than the trench region exposing the body extension.

Subsequently, a body insulating layer and an isolation layer are formed in the trench region exposing the body extension and in the isolation region exposing the buried insulating layer, respectively. An insulated gate pattern crossing over the transistor active region is formed. The gate pattern is formed so that one end of the gate pattern is overlapped with the body insulating layer. Here, a gate insulating layer is formed between the gate pattern and the transistor active region. The body insulating layer is thicker than the gate insulating layer. Thus, even though a predetermined voltage in the range of operating voltage is applied to the gate pattern, it can prevent an inversion channel from being formed at the body extension under the body insulating layer. Impurity ions having the same conductivity type as the semiconductor layer, i.e., a body region of the SOI MOSFET are implanted into the body line active region to form a body line having a low resistivity.

A method of fabricating the SOI integrated circuit in accordance with an embodiment of the invention includes providing an SOI substrate having a supporting substrate, a buried insulating layer and a semiconductor layer which are sequentially stacked. A predetermined region of the semiconductor layer is etched to form a partial trench region defining at least one transistor active region and at least one body contact active region spaced apart from the transistor active region and concurrently leaving a semiconductor residue layer, which is thinner than the semiconductor layer at a bottom of the partial trench region. The semiconductor residue layer is selectively etched until the buried insulating layer is exposed, thereby forming a full trench region surrounding the transistor active region and concurrently leaving a body extension of the first conductivity type connecting the transistor active region to the semiconductor residue layer. A partial trench isolation layer and a full trench isolation layer are formed in the partial trench region and the full trench region, respectively. An insulated gate pattern is formed crossing over the transistor active region and overlapping with the partial trench isolation layer on the body extension.

The present invention further comprises forming source/drain regions of a second conductivity type at both sides of the insulated gate pattern. The source/drain regions are formed to be in contact with the buried insulating layer.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENT OF THE INVENTION

Figure 1:
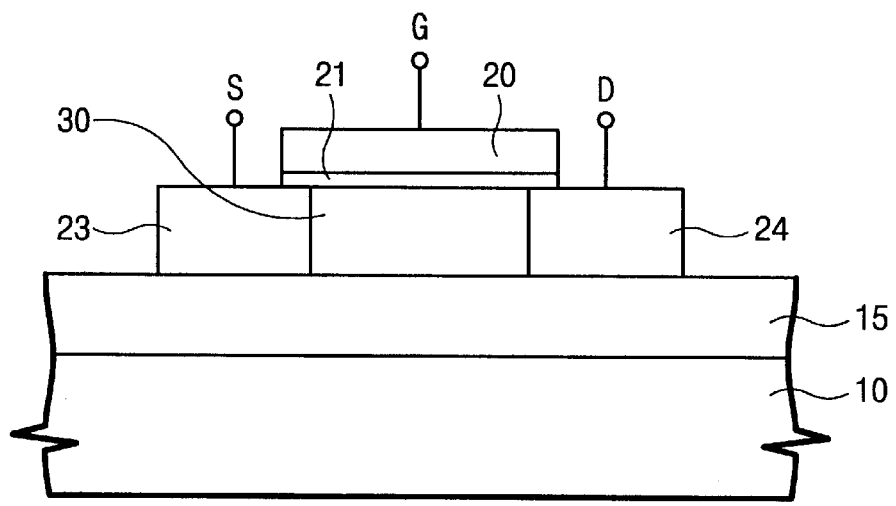
FIG. 1 is a schematic cross-sectional view illustrating a typical SOI MOSFET in accordance with the prior art.
Figure 2A:
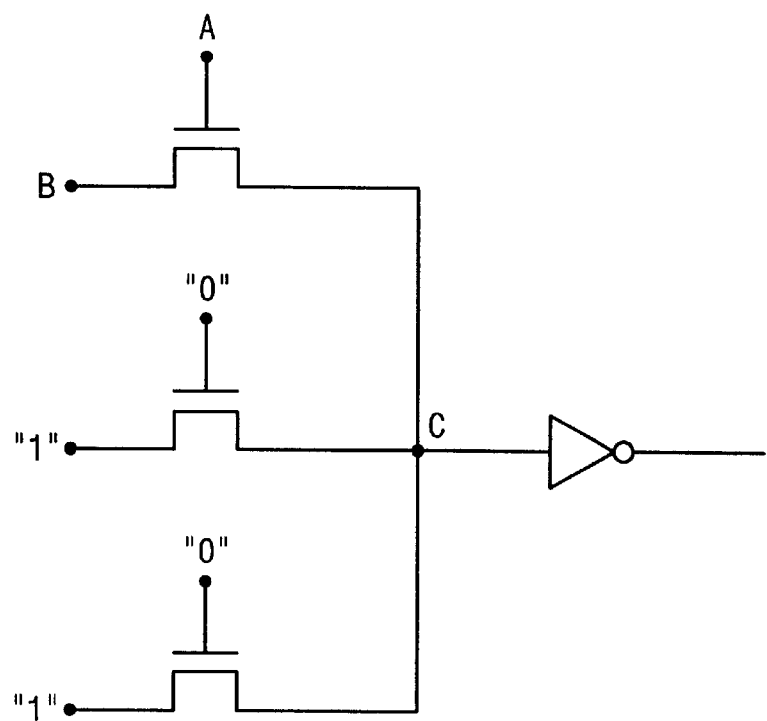
FIG. 2A is a schematic diagram illustrating a prior art multiplexer circuit.
Figure 2B:
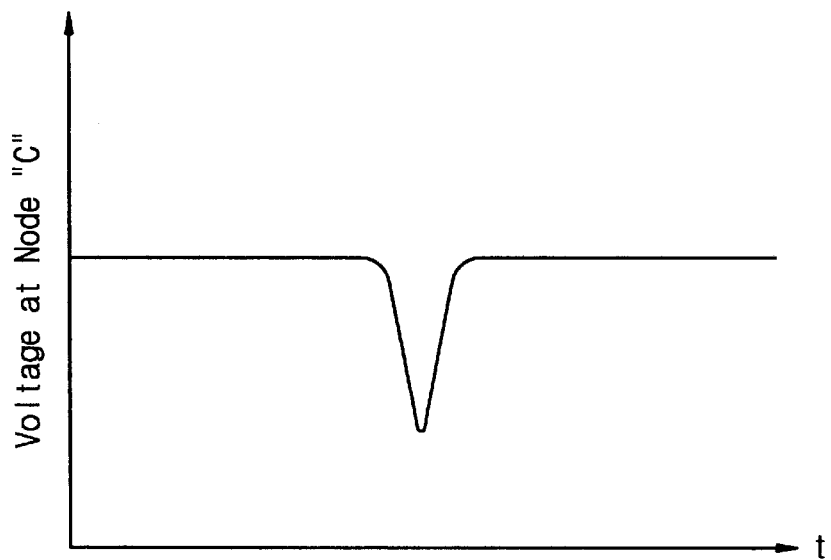
FIG. 2B is a plot illustrating the dynamic leakage current occurring due to the floating body effect in the prior art circuit of FIG. 2A.
Figure 3A:
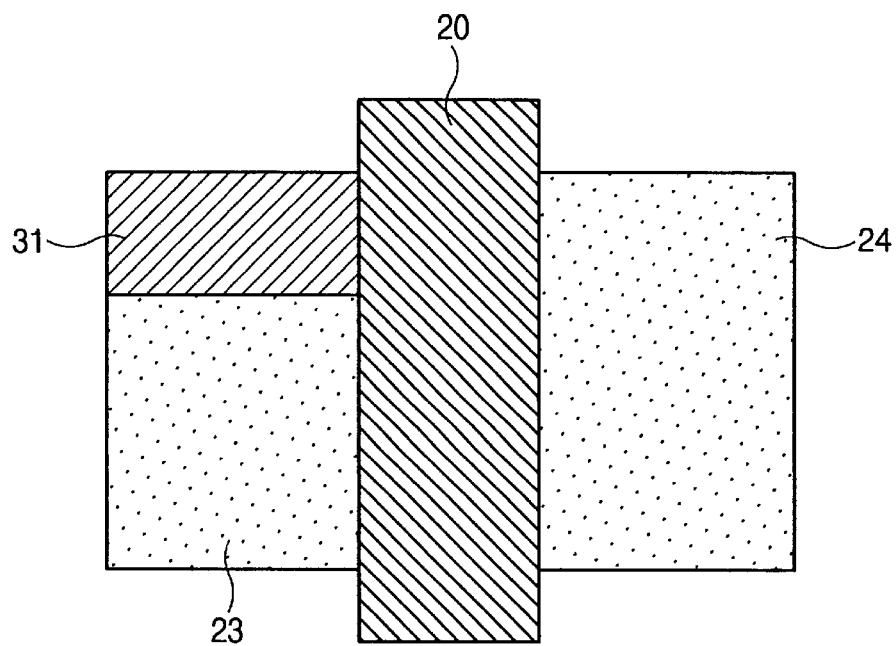
FIGS. 3A and 3B are schematic layouts for body contacted SOI MOSFETs in accordance with the prior art.
Figure 3B:
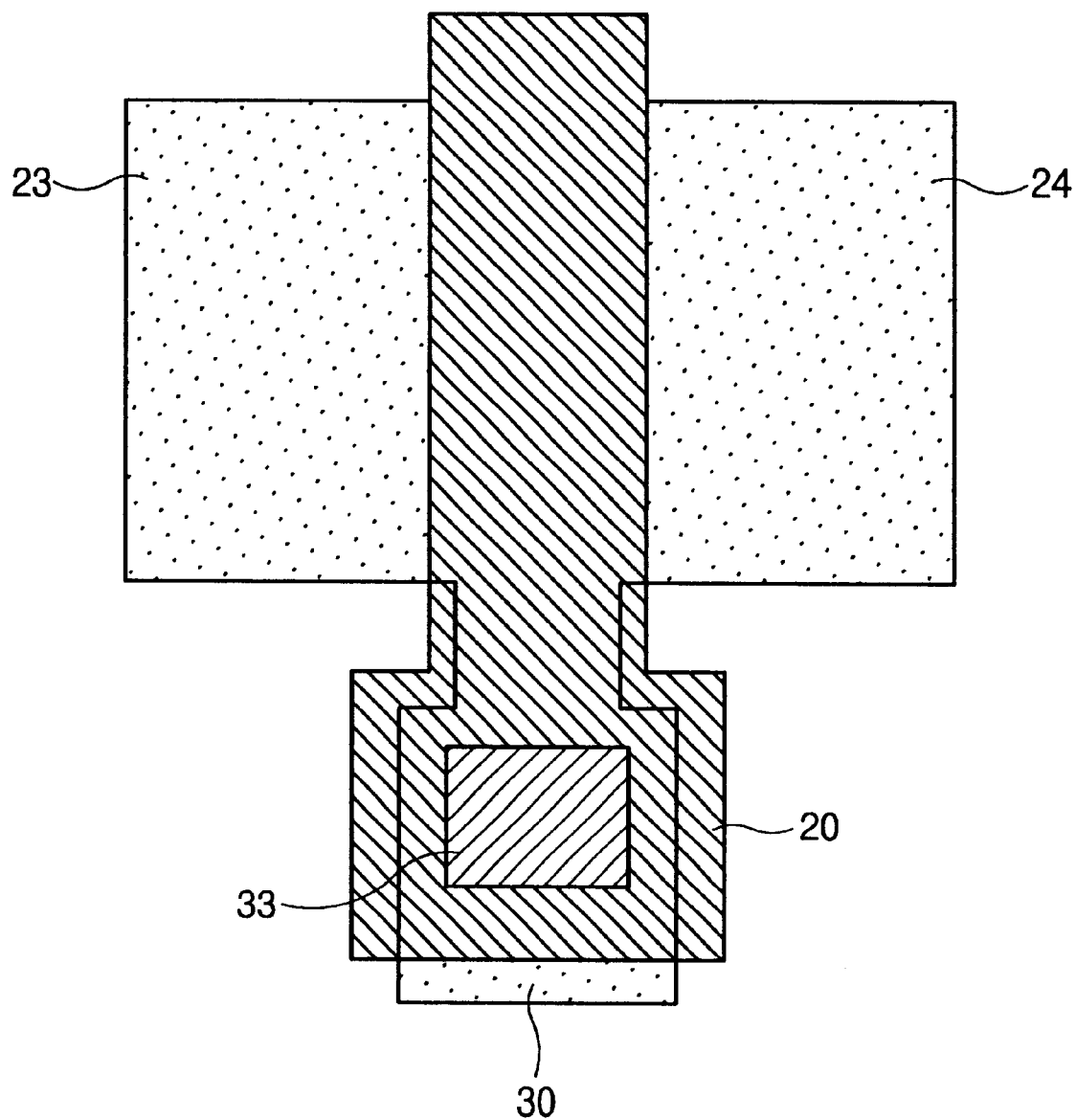
Figure 4A:
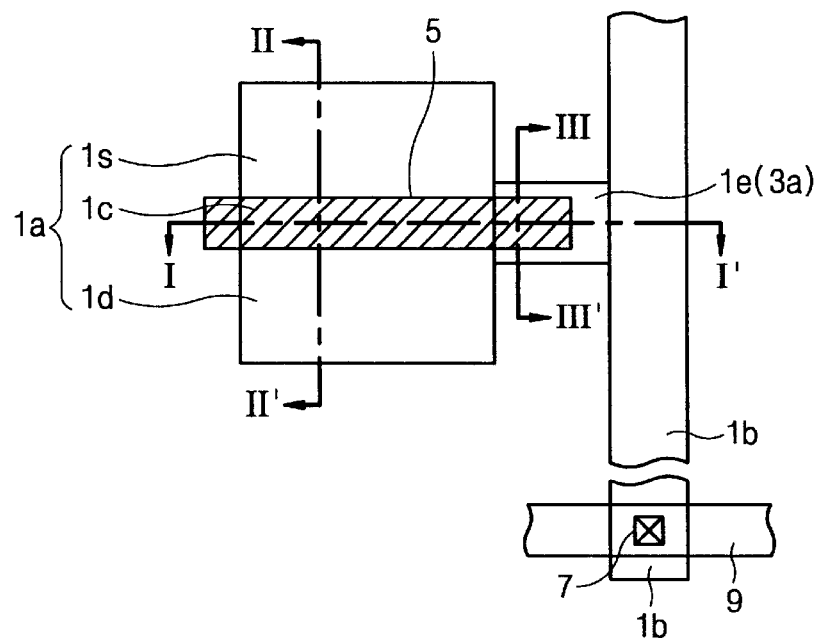
FIG. 4A is a top view of one embodiment of an SOI integrated circuit in accordance with the present invention.
Figure 5:
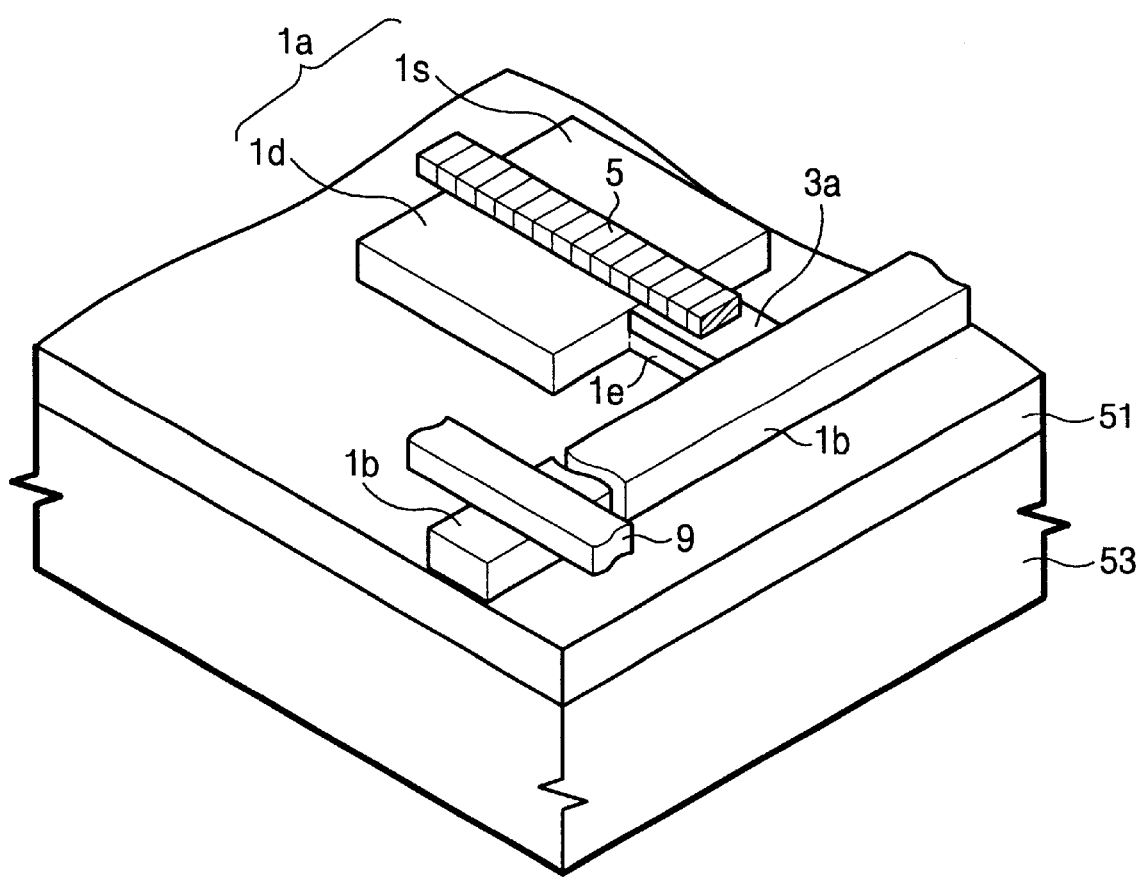
FIG. 5 is a schematic perspective view of the SOI integrated circuit in accordance with the present invention.

The present invention will be explained in detail with reference to the accompanying drawings. FIGS. 4A and 5 are a top view and a perspective view, respectively, showing a portion of an SOI integrated circuit according to an embodiment of the present invention. An SOI integrated circuit in accordance with the invention including N-MOSFETs will be described with reference to FIGS. 4A and 5. However, the present invention is applicable to SOI integrated circuits including P-MOSFETs. Also, the SOI integrated circuit of the present invention could be implemented using N-MOSFETs and P-MOSFETs.

Referring to FIGS. 4A and 5, at least one isolated transistor active region 1*a* is located at a predetermined region of an SOI substrate. A body line 1*b* is disposed at one side of the transistor active region 1*a*. In detail, the transistor active region 1*a* may be disposed at one side of the body line 1*b*. The body line 1*b* is electrically connected to a body extension 1*e* which is extended from a sidewall of the transistor active region 1*a*. Also, the body line 1*b* preferably has a straight line shape. The SOI substrate includes a supporting substrate 53, a buried insulating layer 51 stacked on the supporting substrate 53, and a semiconductor layer stacked on the buried insulating layer 51. The semiconductor layer has a first conductivity type. The first conductivity type may be a P-type or an N-type. In the event that the semiconductor layer is a P-type, an SOI N-MOSFET is formed at the semiconductor layer. In the event that the semiconductor layer is an N-type, an SOI P-MOSFET is formed at the semiconductor layer. The semiconductor layer may be a silicon layer, a germanium layer or a compound semiconductor layer.

The transistor active region 1*a*, the body line 1*b* and the body extension 1*e* are formed of portions of the semiconductor layer. Also, these three regions have the same conductivity type. The body extension 1*e* is thinner than the transistor active region 1*a* and the body line 1*b*, and the bottom surface of the body extension 1*e* is in contact with the buried insulating layer 51. Thus, the top surface of the body extension 1*e* is lower than those of the transistor active region 1*a* and the body line 1*b*. The top surface of the body extension 1*e* is covered with a body insulating layer 3*a*. Also, the buried insulating layer 51 at the periphery of the transistor active region 1*a*, the body line 1*b* and the body extension 1*e* is covered with an isolation layer (not shown).

An insulated gate pattern including a gate electrode 5 is stacked over the transistor active region 1*a*. The gate electrode 5 crosses over the transistor active region 1*a*, and one end of the gate electrode 5 is overlapped with the body insulating layer 3*a*. A gate insulating layer (not shown) is interposed between the gate electrode 5 and the transistor active region 1*a*. The gate insulating layer is thinner than the body insulating layer 3*a*. Thus, even though an operating voltage is applied to the gate electrode 5, it can prevent an inversion channel from being formed at the body extension 1*e* under the body insulating layer 3*a*.

A source region 1*s* of a second conductivity type is formed at the transistor region 1*a* which is located at one side of the gate electrode 5, and a drain region 1*d* of the second conductivity type is formed at the transistor region 1*a* which is located at the other side of the gate electrode 5. Accordingly, the transistor active region 1*a* under the gate electrode 5 corresponds to a body region 1*c* including a channel region. The gate electrode 5, the source/drain regions 1*s* and 1*d*, and the body region 1*c* constitute an SOI MOSFET. In addition, an insulating spacer (not shown) may be formed on a sidewall of the gate electrode 5 or the gate pattern including the gate electrode 5. A metal silicide layer (not shown) may be selectively stacked on the source/drain regions 1*s* and 1*d* and the body line 1*b*. The metal silicide layer is electrically isolated from the gate electrode due to the presence of the insulating spacer. Also, the metal silicide layer may be further stacked on the gate electrode 5.

The SOI substrate including the SOI MOSFET and the metal silicide layer is covered with an interlayer insulating layer (not shown). An interconnection line 9 such as a power line or a ground line is disposed on the interlayer insulating layer. The interconnection line 9 is electrically connected to the body line 1*b* through a contact hole 7 penetrating a portion of the interlayer insulating layer. Here, in the event that the SOI MOSFET is a P-MOSFET, the interconnection line corresponds to the power line. In the event that the SOI MOSFET is an N-MOSFET, the interconnection line corresponds to the ground line.

Figure 4B:
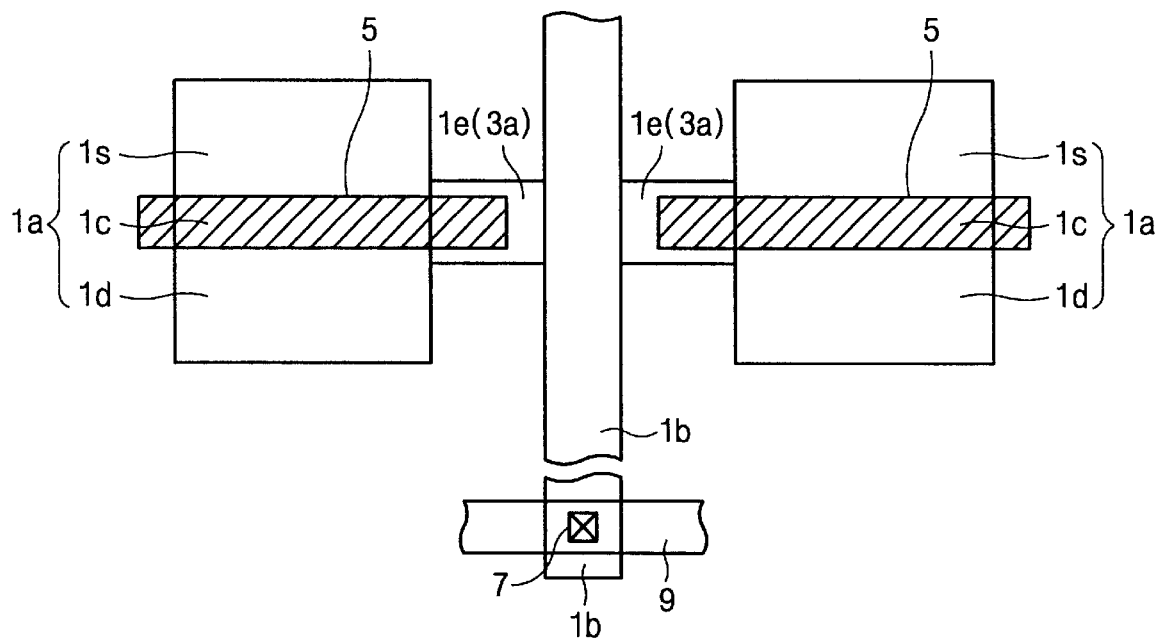
FIG. 4B is a top view of another embodiment of an SOI integrated circuit in accordance with the present invention.

A plurality of SOI MOSFETs may be disposed at both sides of the body line 1*b*, as shown in FIG. 4B. Here, each of the SOI MOSFETs has the same structure as the SOI MOSFET described in connection with FIGS. 4A and 5.

FIGS. 6A to 11A, FIGS. 6B to 11B and FIGS. 6C to 11C are cross-sectional views for illustrating fabrication methods of SOI integrated circuits according to the present invention. FIGS. 6A to 11A are cross-sectional views taken along the line I–I' of FIG. 4A, and FIGS. 6B to 11B are cross-sectional views taken along the line II–II' of FIG. 4. Also, FIGS. 6C to 11C are cross-sectional views taken along the line III–III' of FIG. 4.

Figure 6A:
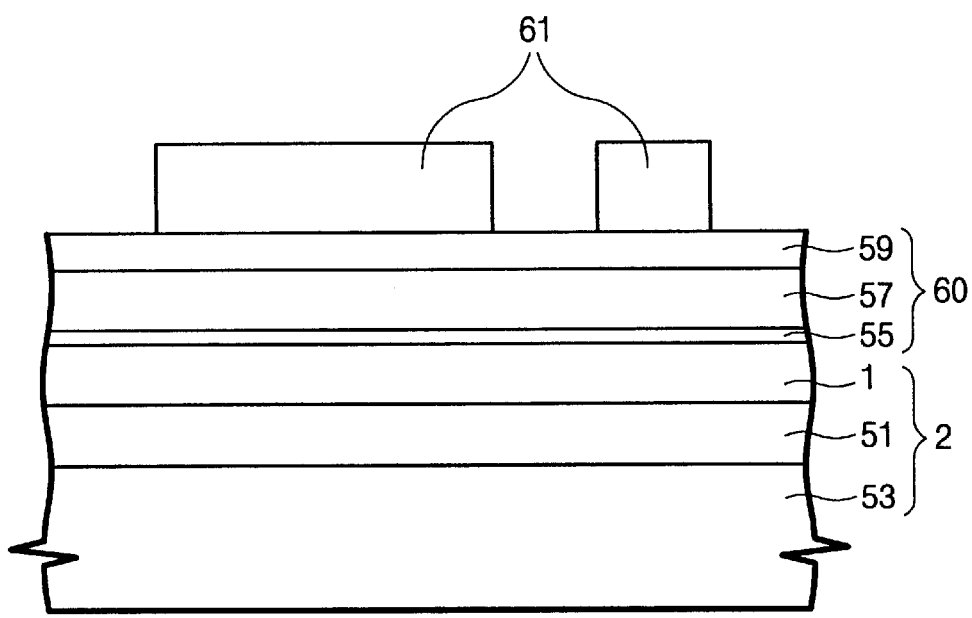
FIGS. 6A, 7A, 8A, 9A, 10A and 11A are cross-sectional views taken along the line I–I' of FIG. 4A for illustrating a method of fabricating SOI integrated circuit according to one embodiment of the present invention.
Figure 6B:
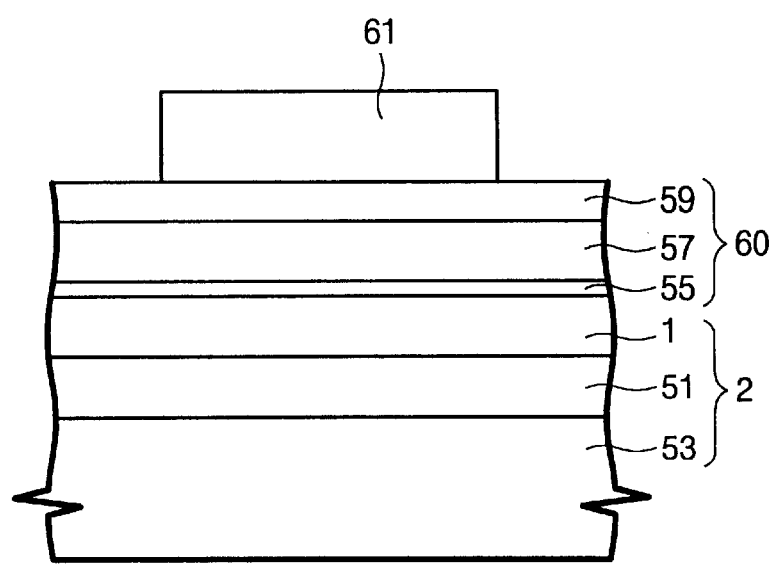
FIGS. 6B, 7B, 8B, 9B, 10B and 11B are cross-sectional views taken along the line II–II' of FIG. 4A for illustrating a method of fabricating SOI integrated circuit according to one embodiment of the present invention.
Figure 6C:
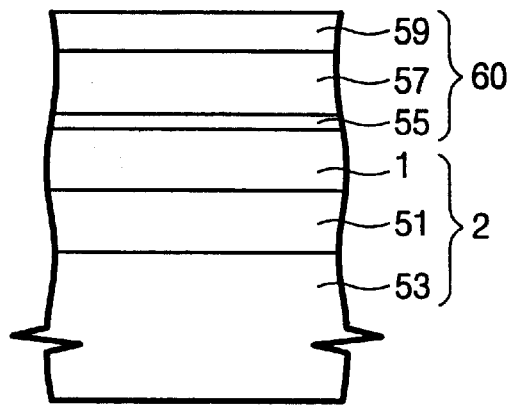
FIGS. 6C, 7C, 8C, 9C, 10C and 11C are cross-sectional views taken along the line III–III' of FIG. 4A for illustrating a method of fabricating SOI integrated circuit according to one embodiment of the present invention.

Referring to FIGS. 6A, 6B and 6C, a trench mask layer 60 is formed on an SOI substrate 2. The SOI substrate 2 includes a supporting substrate 53, a buried insulating layer 51 formed on the supporting substrate 53 and a semiconductor layer 1 formed on the buried insulating layer 51. Here, the semiconductor layer 1 has a first conductivity type such as a P-type. However, the first conductivity type may be an N-type. Thus, the trench mask layer 60 is formed on the semiconductor layer 1 of the first conductivity type. The trench mask layer 60 comprises a pad oxide layer 55 and a pad nitride layer 57 which are sequentially stacked. In addition, the trench mask layer may further comprise a hard mask layer 59 formed on the pad nitride layer 57. The hard mask layer 59 is preferably formed of a CVD oxide layer having a high etching selectivity with respect to the semiconductor layer 1 such as a silicon layer. First photoresist patterns 61 are formed on the trench mask layer 60. At least one of the first photoresist patterns 61 defines at least one isolated transistor active region. The other defines a body line active region at one side of the transistor active region.

Figure 7A:
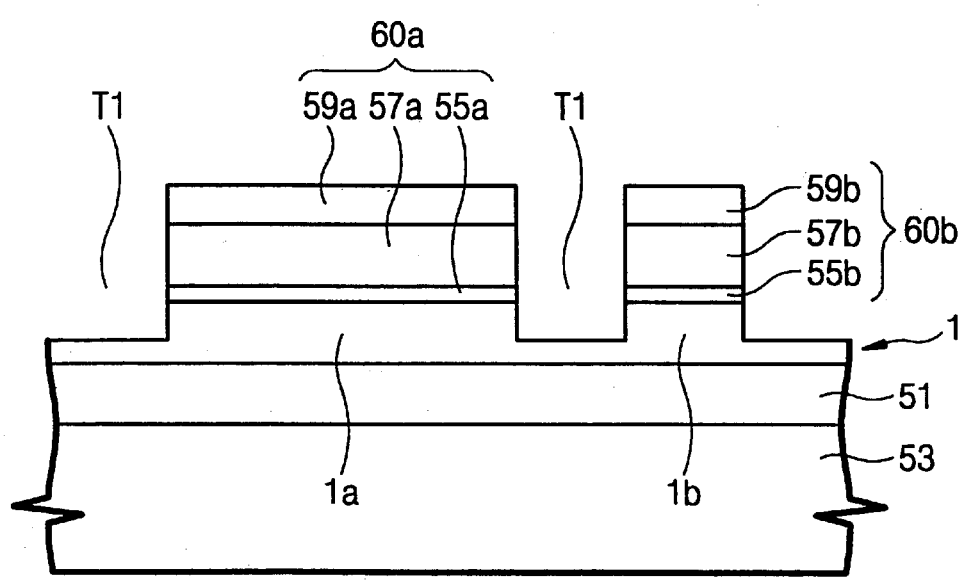
Figure 7B:
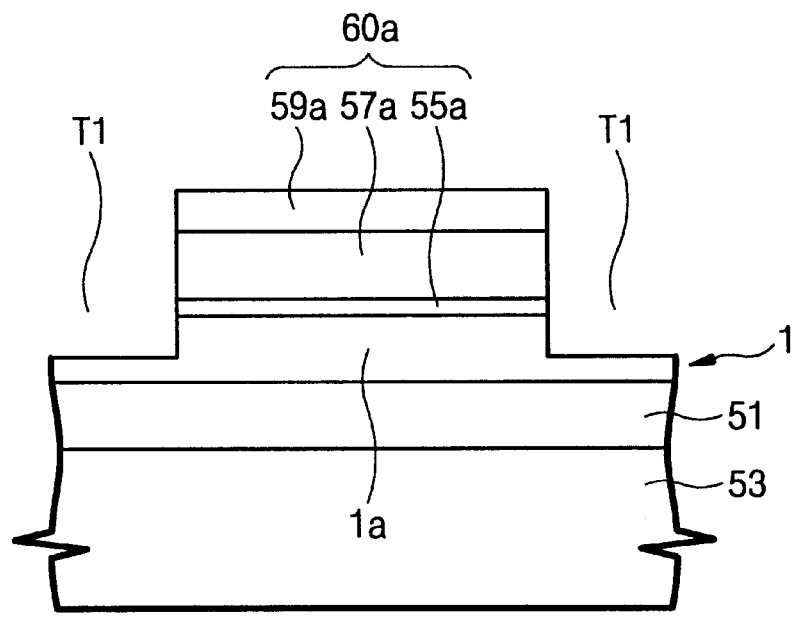
Figure 7C:
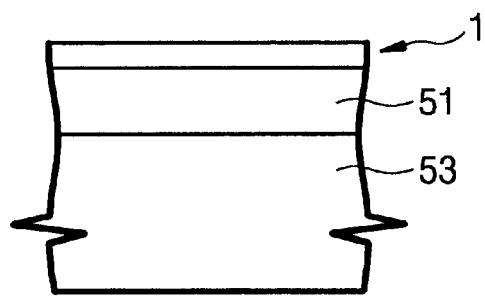

Referring to FIGS. 7A, 7B and 7C, the trench mask layer 60 is etched using the first photoresist patterns 61 as etching masks until the semiconductor layer 1 is exposed. As a result, at least one first trench mask pattern 60*a* and a second trench mask pattern 60*b* are formed. The first trench mask pattern 60*a* comprises a first pad oxide pattern 55*a*, a first pad nitride pattern 57*a* and a first hard mask pattern 59*a* which are sequentially stacked. Similarly, the second trench mask pattern 60*b* comprises a second pad oxide pattern 55*b*, a second pad nitride pattern 57*b* and a second hard mask pattern 59*b* which are sequentially stacked. The first photoresist patterns 61 are then removed.

Subsequently, the exposed semiconductor layer 1 is etched using the first and second trench mask patterns 60*a* and 60*b* as etching masks, to thereby form a trench region T1. At this time, the exposed semiconductor layer 1 is etched by a predetermined thickness which is thinner than that of the semiconductor layer 1. As a result, a semiconductor residue layer exists at the bottom of the trench region T1. Also, at least one transistor active region 1*a* and a body line active region 1b are defined by the trench region T1. Accordingly, the buried insulating layer 51 outside the transistor active region 1a and the body line active region 1b is still covered with the semiconductor residue layer.

Figure 8A:
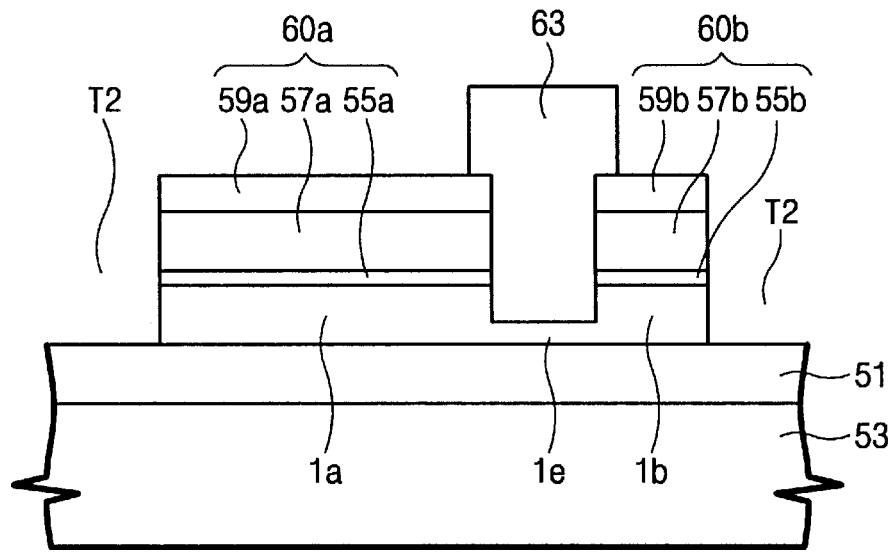
Figure 8B:
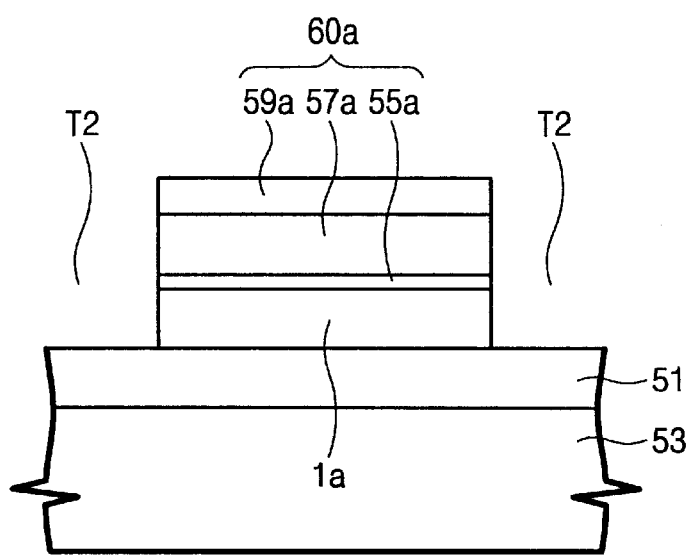
Figure 8C:
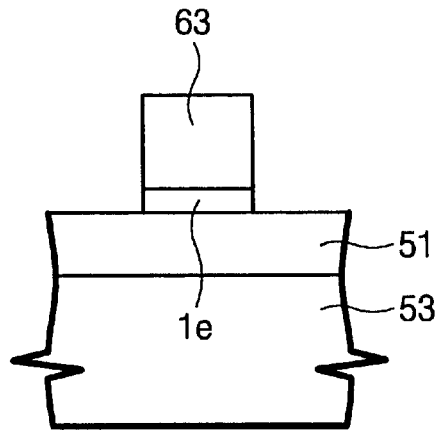

Referring to FIGS. 8A, 8B and 8C, a second photoresist pattern 63 is formed on a predetermined region of the semiconductor residue layer. The second photoresist pattern 63 covers a portion of the semiconductor residue layer between the transistor active region 1a and the body line active region 1b, as shown in FIGS. 8A and 8C. The semiconductor residue layer is etched using the second photoresist pattern 63 and the first and second trench mask patterns 60a and 60b as etching masks until the buried insulating layer 51 is exposed. As a result, an isolation region T2 exposing the buried insulating layer 51 is formed. At this time, a body extension 1e including a portion of the semiconductor residue layer is also formed under the second photoresist pattern 63, as shown in FIGS. 8A and 8C. Therefore, the body line active region 1b is electrically connected to the transistor active region 1a through the body extension 1e.

Figure 9A:
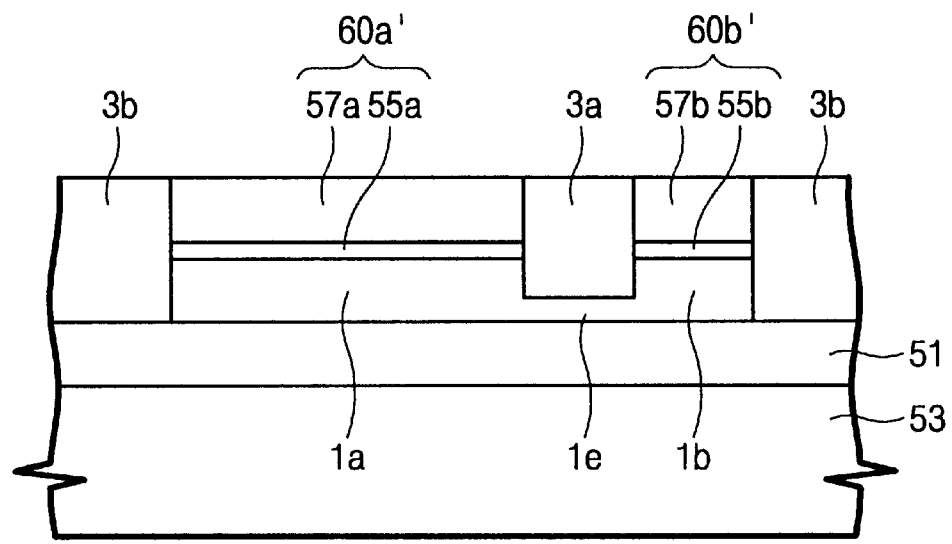
Figure 9B:
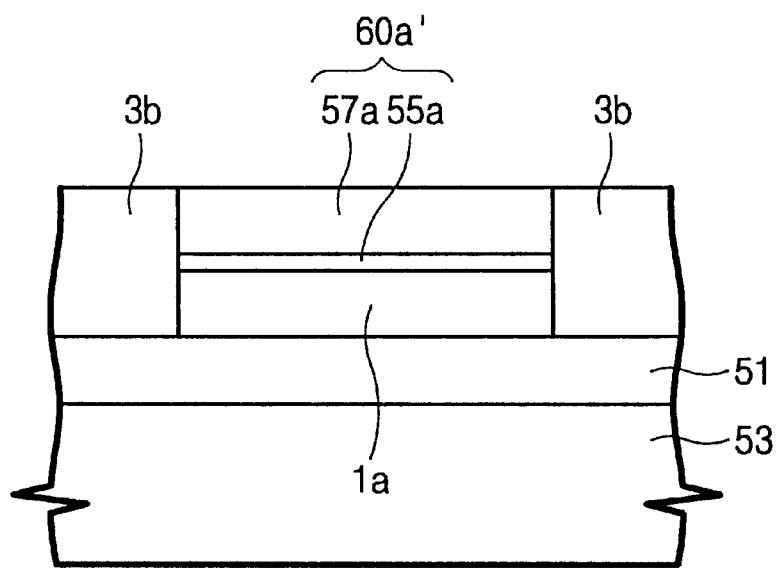
Figure 9C:
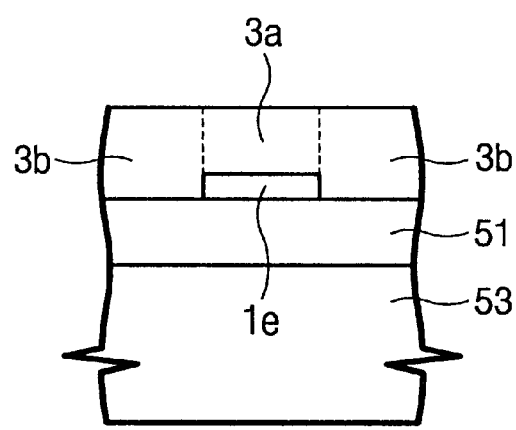

Referring to FIGS. 9A, 9B and 9C, the second photoresist pattern 63 is then removed. An insulating layer such as a CVD oxide layer is formed on the entire surface of the substrate including the trench region T1 and the isolation region T2. At this time, it is preferable that the trench region T1 and the isolation region T2 be completely filled with the insulating layer.

The insulating layer is then planarized until the first and second trench mask patterns 60a and 60b are exposed, thereby forming a body insulating layer 3a on the body extension 1e as well as an isolation layer 3b on the buried insulating layer 51. At this time, the first and second pad nitride patterns 57a and 57b act as etch stoppers. Thus, in the event that the trench mask layer 60 comprises the CVD oxide layer 59, the first and second hard mask patterns 59a and 59b are removed during the planarization process such as an etch-back process or a CMP (chemical mechanical polishing) process. As a result, first and second transformed trench mask patterns 60a and 60b are left after formation of the body insulating layer 3a and the isolation layer 3b.

Figure 10A:
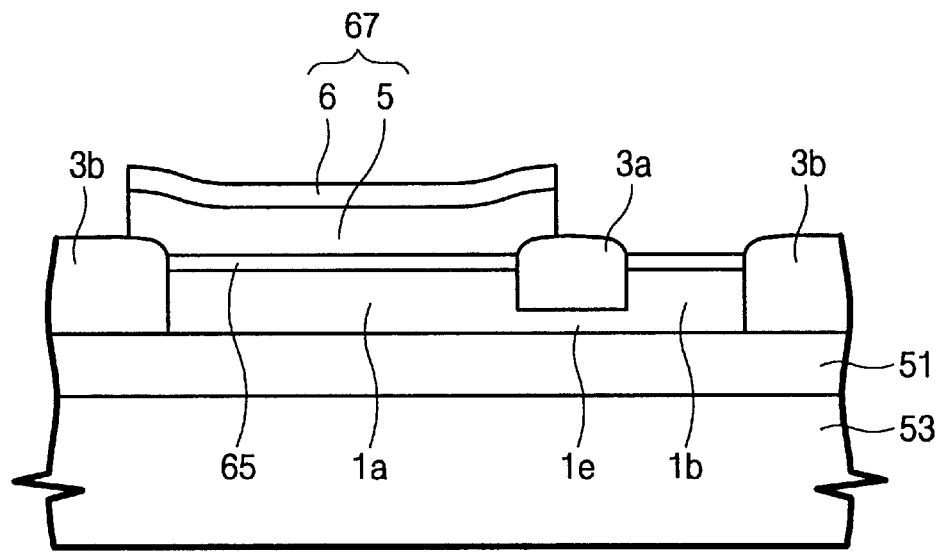
Figure 10B:
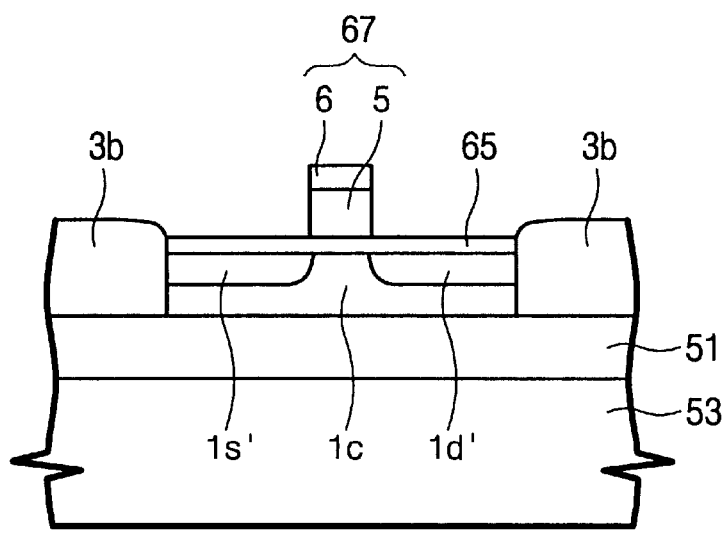
Figure 10C:
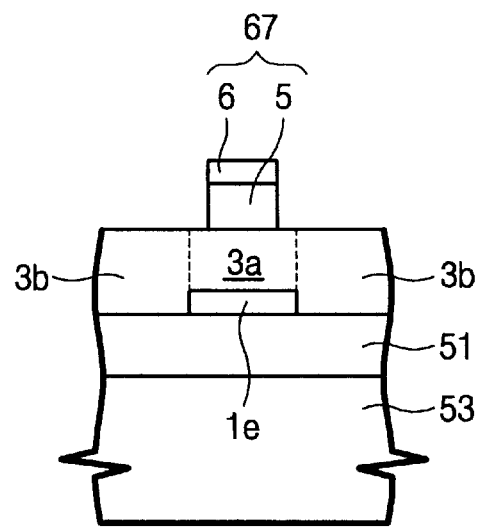

Referring to FIGS. 10A, 10B and 10C, the first and second transformed trench mask patterns 60a and 60b are then removed using a conventional technique, to thereby expose the transistor active region 1a and the body line active region 1b. A gate insulating layer 65 is formed on the exposed transistor active region 1a and the exposed body line active region 1b. A gate material layer is formed on the entire surface of the substrate including the gate insulating layer 65. The gate material layer is formed by sequentially stacking a conductive layer and a capping insulating layer. Preferably, the conductive layer is formed of a doped polysilicon layer and the capping insulating layer is formed of a CVD oxide layer or a silicon nitride layer.

Alternatively, the gate material layer may be formed of only the conductive layer. The gate material layer is then patterned to form an insulated gate pattern 67 crossing over the transistor active region 1a. Also, one end of the gate pattern 67 is overlapped with the body insulating layer 3a, as shown in FIGS. 10A and 10C. In the event that the gate material layer is formed by sequentially stacking the conductive layer and the capping insulating layer, the insulated gate pattern 67 comprises a gate electrode 5 formed of the conductive layer and a capping insulating layer pattern 6 formed of the capping insulating layer. However, in the event that the formation of the capping insulating layer is omitted, the insulated gate pattern 67 is formed of only the gate electrode 5.

Figure 11A:
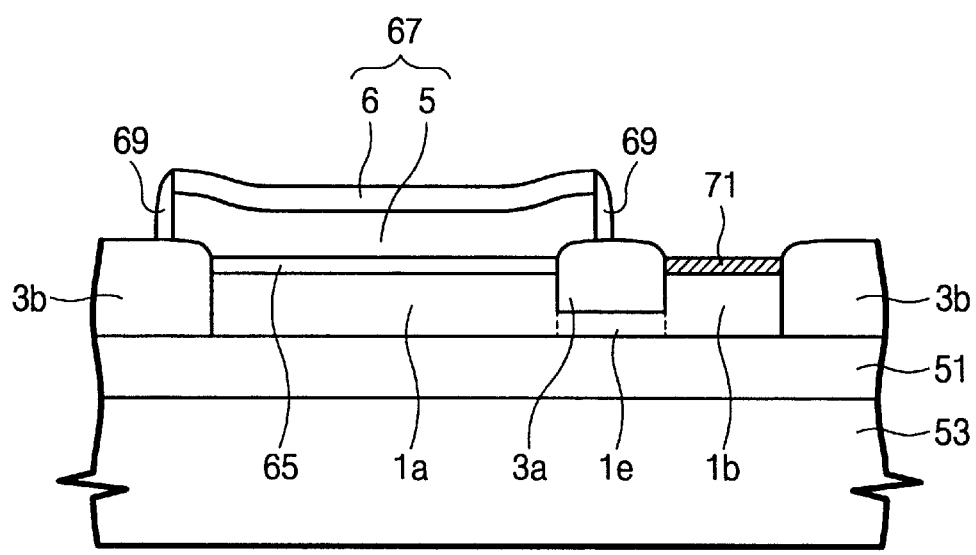
Figure 11B:
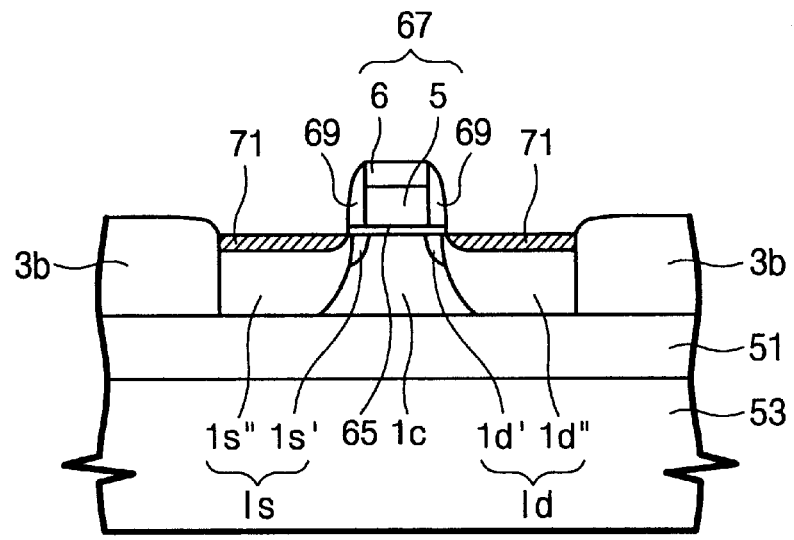
Figure 11C:
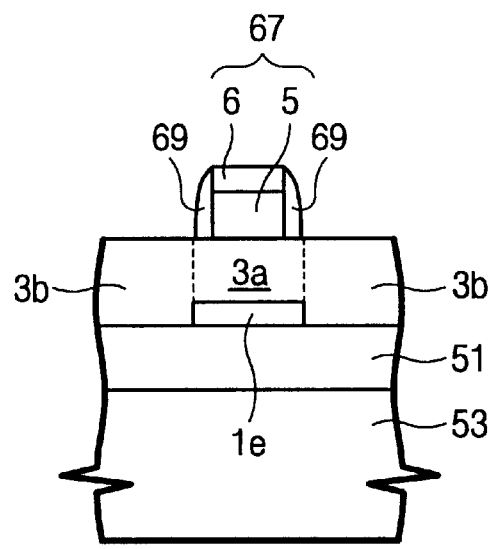

Impurities of a second conductivity type are selectively implanted into the transistor active region 1a using the gate pattern 67 as an implantation mask, thereby forming low concentration impurity regions 1s and 1d at both sides of the gate pattern 67, respectively. The second conductivity type is opposite to the first conductivity type. For example, if the first conductivity type is P-type, the second conductivity type is N-type. The transistor active region 1a between the low concentration impurity regions 1s and 1d corresponds to a body region 1c. The body region 1c includes a channel region which is located under the gate pattern 67. Referring to FIGS. 11A, 11B and 11C, an insulating spacer 69 is then formed on the sidewall of the insulated gate pattern 67 using a conventional technique. The insulating spacer 69 is formed of a silicon oxide layer or a silicon nitride layer. Subsequently, impurities of the second conductivity type are selectively implanted into the transistor active region 1a using the gate pattern 67 and the insulating spacer 69 as implantation masks, thereby forming high concentration impurity regions 1s and 1d at both sides of the gate pattern 67. As a result, the low concentration impurity regions 1s and 1d exist under the insulating spacer 69. Thus, LDD (lightly doped drain)-type source and drain regions 1s and 1d are formed at both sides of the gate pattern 67. Therefore, the body region 1c is electrically connected to the body line active region 1b through the body extension 1e, as shown in FIGS. 11A, 11B and 11C. Here, the gate electrode 5, the source/drain regions 1s and 1d, and the body region 1c constitute an SOI MOSFET.

Impurities of the first conductivity type are selectively implanted into the body line active region 1b in order to form a body line 1b having a relatively low resistance. A cleaning process is applied to the surface of the resultant structure, thereby exposing the surfaces of the source and drain regions 1s and 1d and the body line 1b. A metal silicide layer 71 may be selectively formed on the exposed body line 1b as well as the exposed source and drain regions 1s and 1d using a conventional SALICIDE(self-aligned silicide) process. The metal silicide layer 71 is formed of a refractory metal silicide layer such as a titanium silicide layer, a tantalum silicide layer, or a cobalt silicide layer. In the event that the gate pattern 67 is formed of only the gate electrode 5, the metal silicide layer 71 is also formed on the gate electrode 5.

An interlayer insulating layer (not shown) is formed on the entire surface of the substrate including the metal silicide layer 71. The interlayer insulating layer is patterned to form a contact hole 7 (see FIG. 4) exposing a portion of the body line 1b. A conductive layer filling the contact hole 7 is formed on the interlayer insulating layer and patterned to form a interconnection line 9 (see FIGS. 4 and 5) which is electrically connected to the body line 1b via the contact hole 7. The interconnection line 9 may be a power line or a ground line. For example, if the SOI MOSFET is an N-MOSFET, the interconnection line 9 corresponds to the ground line. If the SOI MOSFET is a P-MOSFET, the interconnection line 9 corresponds to the power line.

Figure 12:
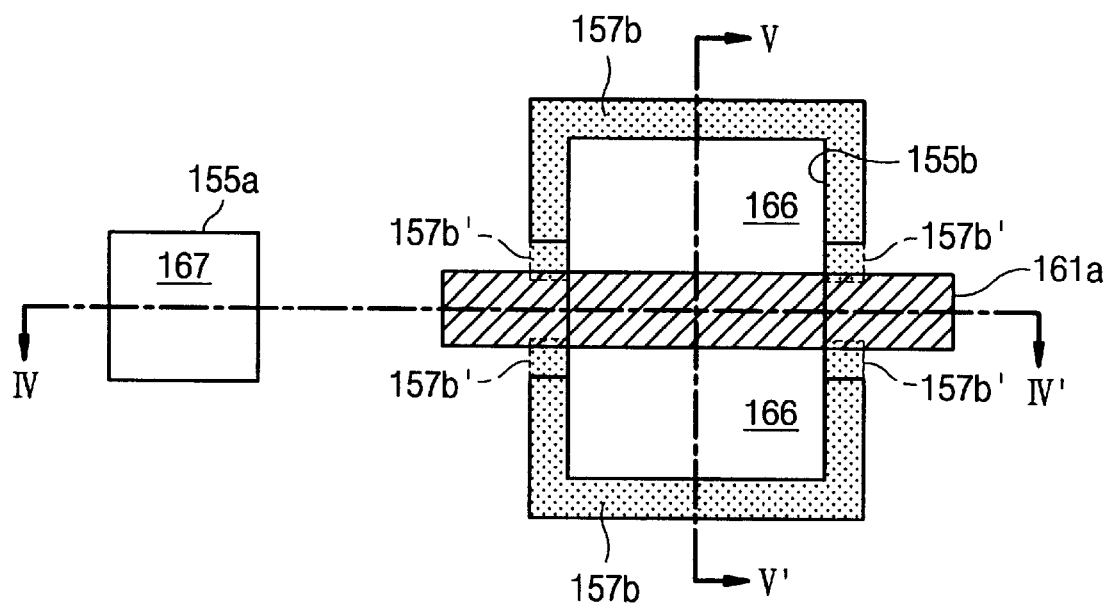
FIG. 12 is a top plan view of still another embodiment of an SOI integrated circuit according to the present invention.

FIG. 12 is a top plan view showing an SOI integrated circuit according to the present invention. Also, FIG. 13 is a cross sectional view taken along the line IV–IV' of FIG. 12 for illustrating the SOI integrated circuit according to the present invention, and FIG. 14 is a cross sectional view taken along the line V–V' of FIG. 12 for illustrating the SOI integrated circuit according to the present invention.

Figure 13:
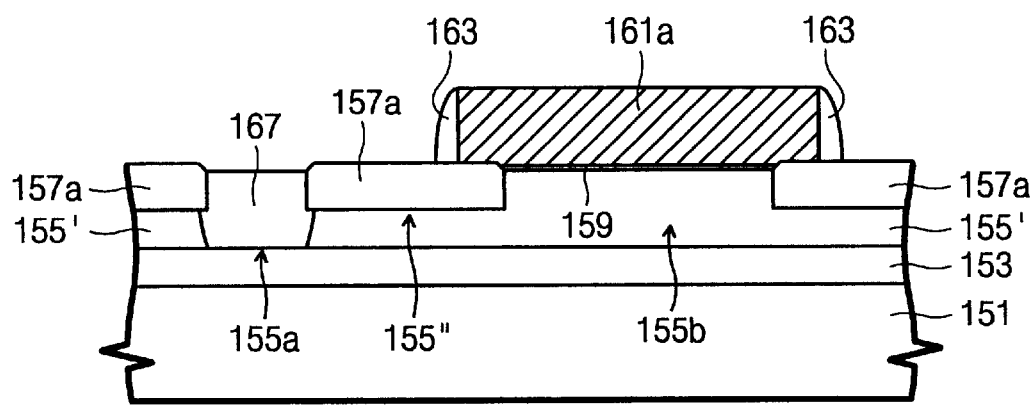
FIG. 13 is a cross sectional view taken along the line IV–IV' of FIG. 12 for illustrating the SOI integrated circuit according to the present invention.
Figure 14:
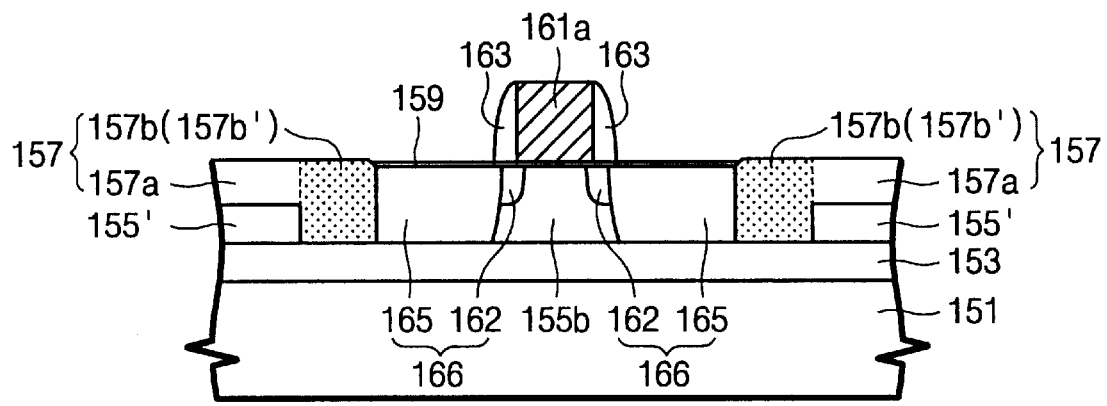
FIG. 14 is a cross sectional view taken along the line V–V' of FIG. 12 for illustrating the SOI integrated circuit according to the present invention.

Referring to FIGS. 12, 13 and 14, a partial trench isolation layer 157a is formed at a predetermined region of a semiconductor layer having a first conductivity type. The first conductivity type is one of p-type and n-type. The semiconductor layer, e.g., a silicon layer is stacked on a buried insulating layer 153 and the buried insulating layer 153 is disposed on a supporting substrate 151. The partial trench isolation layer 157a defines a transistor active region 155b and a body contact active region 155a spaced apart from the transistor active region 155b. A semiconductor residue layer 155' is intervened between the partial trench isolation layer 157a and the buried insulating layer 153 and is thinner than the body contact active region 155a and transistor active region 155b. A full trench isolation layer 157b is interposed between the partial trench isolation layer 157a and the transistor active region 155b. The full trench isolation layer 157b is in contact with the buried insulating layer 153. The transistor active region 155b is connected to the semiconductor residue layer 155' through a body extension 155" which is extended from a portion of the sidewall of the semiconductor residue layer 155' toward the transistor active region 155b. The body extension 155" is covered with the partial trench isolation layer 157a. As a result, most of the sidewall of the transistor active region 155b is surrounded by the full trench isolation layer 157b. The partial trench isolation layer 157a and the full trench isolation layer 157b constitute an isolation layer 157.

An insulated gate pattern 161a is disposed to cross over the transistor active region 155b and is overlapped with the partial trench isolation layer 157a on the body extension 155". The insulated gate pattern 161a is separated from the transistor active region 155b by a gate dielectric layer 159, which is intervened therebetween. In the meantime, the full trench isolation layer 157b may comprise a first full trench isolation layer and a second full trench isolation layer, which are separated each other as shown in FIG. 12. The first and second full trench isolation layers are symmetrical to the insulated gate pattern 161a. The first and second full trench isolation layers may be extended toward the insulated gate pattern 161a so that the ends of the first and second full trench isolation layers are overlapped with the insulated gate pattern 161a (see 157b' of FIG. 12). In this case, the width of the body extension 155" is narrower than that of the insulated gate pattern 161a.

Source/drain regions 166 are formed at the transistor active region 155b, which is located at both sides of the insulated gate pattern 161a. The source/drain regions 166 have a second conductivity type opposite to the first conductivity type. Preferably, the source/drain regions 166 are in contact with the buried insulating layer 153. The source/drain regions 166 may have a lightly doped drain (LDD) structure including a lightly doped region 162 and a heavily doped region 165. These LDD shaped source/drain regions 166 may be realized using a spacer 163 formed on the sidewall of the insulated gate pattern 161a. As a result, most (or all) of the sidewalls of the source/drain regions 166 are surrounded by the full trench isolation layer 157b (or 157b'). Also, the bottoms of the source/drain regions 166 are in contact with the buried insulating layer 153. Accordingly, the source/drain junction capacitance is remarkably reduced, as compared with the conventional SOI technique. In addition, the latch-up immunity is enhanced because of the presence of the full trench isolation layer 157b (or 157b'). A well contact region 167 of the first conductivity type is then formed at the body contact active region 155a. Thus, the well contact region 167 is electrically connected to the transistor active region 155b (body region) between the source/drain regions 166 through the body extension 155" and the semiconductor residue layer 155'.

FIGS. 15A to 20A and FIGS. 15B to 20B are cross sectional views for illustrating fabrication methods of SOI integrated circuits according to the present invention. FIGS. 15A to 20A are cross sectional views taken along the line IV–IV' of FIG. 12, and FIGS. 15B to 20B are cross sectional views taken along the line V–V' of FIG. 12.

Figure 15A:
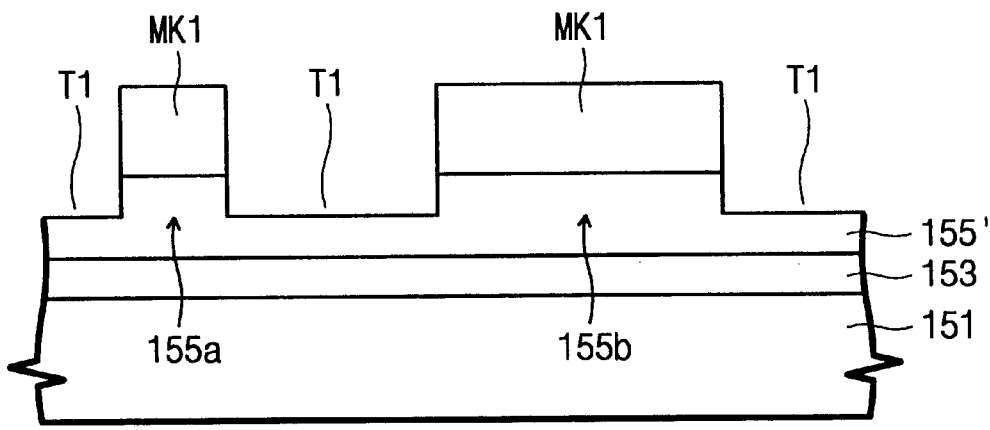
FIGS. 15A, 16A, 17A, 18A, 19A and 20A are cross-sectional views taken along the line IV–IV' of FIG. 12 for illustrating a method of fabricating SOI integrated circuit according to another embodiment of the present invention.
Figure 15B:
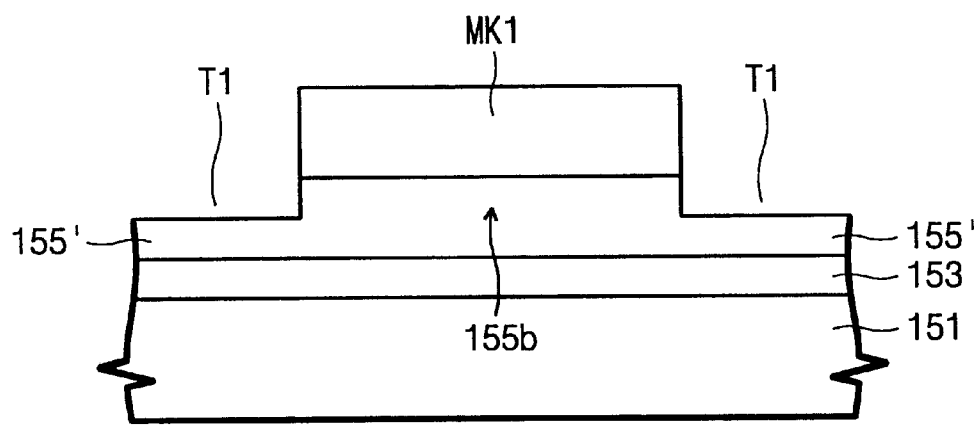
FIGS. 15B, 16B, 17B, 18B, 19B and 20B are cross-sectional views taken along the line V–V' of FIG. 12 for illustrating a method of fabricating SOI integrated circuit according to another embodiment of the present invention.

Referring to FIGS. 15A and 15B, a first trench mask pattern MK1 is formed on an SOI substrate including a supporting substrate 151, a buried insulating layer 153 on the supporting substrate 151 and a semiconductor layer of a first conductivity type on the buried insulating layer 153. The semiconductor layer may be a silicon layer, and the first trench mask pattern MK1 is formed on the semiconductor layer. The first trench mask pattern MK1 comprises at least two separated mask patterns. The semiconductor layer is etched using the first trench mask pattern MK1 as an etching mask, thereby forming a partial trench region T1 and concurrently defining a body contact active region 155a and a transistor active region 155b spaced apart from the body contact active region. The depth of the partial trench region T1 is less than the thickness of the semiconductor layer. Thus, a semiconductor residue layer 155', which is thinner than the semiconductor layer, exists under the partial trench region T1. Here, the first trench mask pattern MK1 is formed by depositing a first trench mask layer on the semiconductor layer and patterning the first trench mask layer. The first trench mask layer comprises a pad oxide layer and a pad nitride layer, which are sequentially stacked.

Figure 16A:
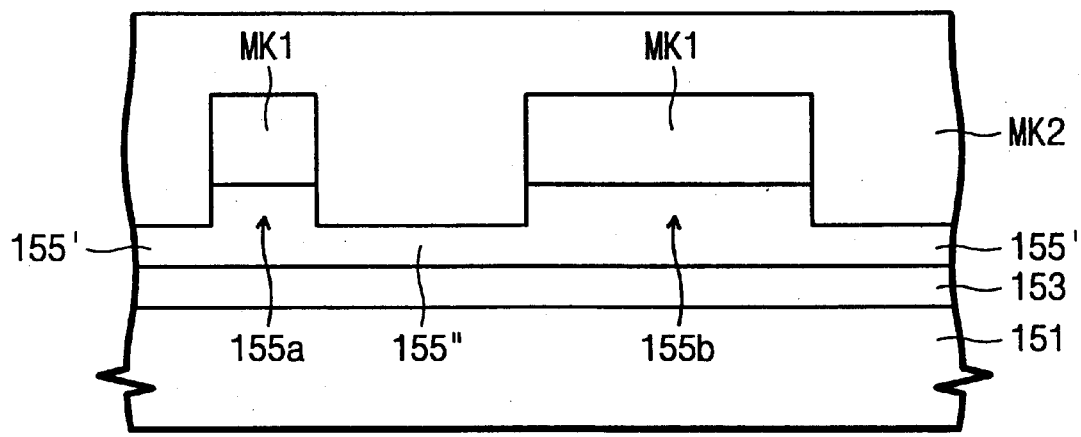
Figure 16B:
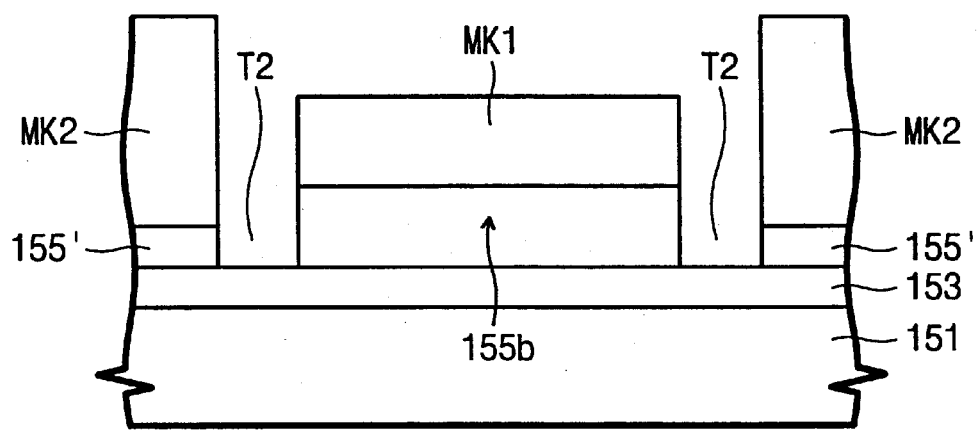

Referring to FIGS. 16A and 16B, a second trench mask layer is formed on an entire surface of the substrate including the partial trench region T1 and the first trench mask pattern MK1. The second trench mask layer is preferably formed of a photoresist layer. The second trench mask layer is patterned using a conventional photolithography process to form a second trench mask pattern MK2 exposing the semiconductor residue layer 155' around the transistor active region 155b. Also, the first trench mask pattern MK1, which is disposed on the transistor active region 155b, may be exposed by the second trench mask pattern MK2. However, a portion of the semiconductor residue layer 155' around the transistor active region 155b should be covered with the second trench mask pattern MK2. Using the first and second trench mask patterns MK1 and MK2 as etching masks, the exposed semiconductor residue layer 155' is etched until the buried insulating layer 153 is exposed. As a result, a full trench region T2 is formed around the transistor active region 155b and a body extension 155" is defined between the transistor active region 155b and the body contact active region 155a, The transistor active region 155b is electrically connected to the body contact active region 155a through the body extension 155" and the semiconductor residue layer 155'. The full trench region T2 may include two separated full trench regions. In this case, the body extension 155" is disposed between the two separated full trench regions.

Figure 17A:
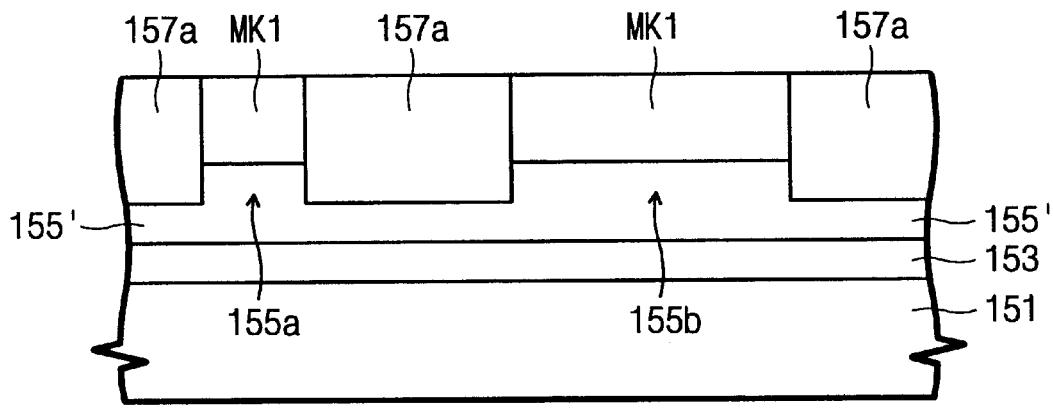
Figure 17B:
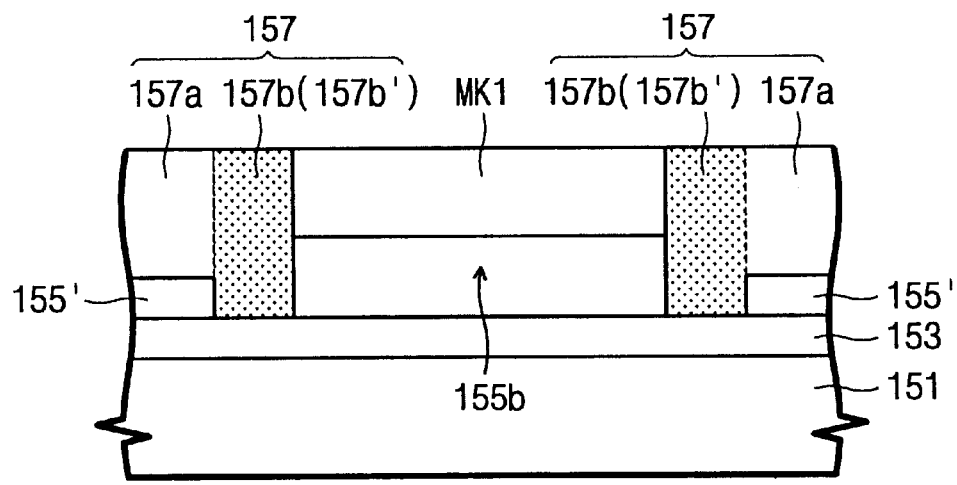

Referring to FIGS. 17A and 17B, the second trench mask pattern MK2 is selectively removed. An insulating layer is then formed on an entire surface of the resultant structure where the second trench mask pattern MK2 is removed. The insulating layer is planarized until the first trench mask pattern MK1 is exposed, thereby forming an isolation layer 157 in the partial trench region T1 and the full trench region T2. The planarization of the insulating layer may be performed using a chemical mechanical polishing (CMP) process or an etch-back process. The isolation layer 157 comprises a partial trench isolation layer 157a filling the partial trench region T1 and a full trench isolation layer 157b filling the full trench region T2. The body extension 155" and the semiconductor residue layer 155' are covered with the partial trench isolation layer 157a. In the meantime, the two separated full trench regions T2 may be formed to be more close each other. In this case, the width of the body extension 155" is relatively reduced and extended full trench isolation layers 157b' is formed (see FIG. 12).

Figure 18A:
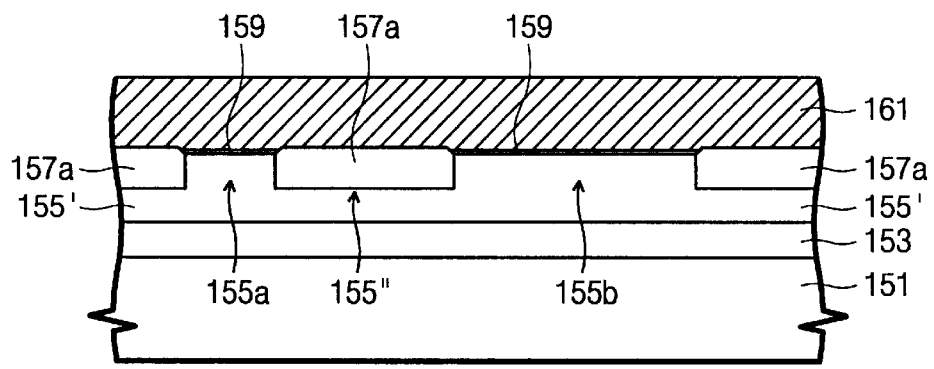
Figure 18B:
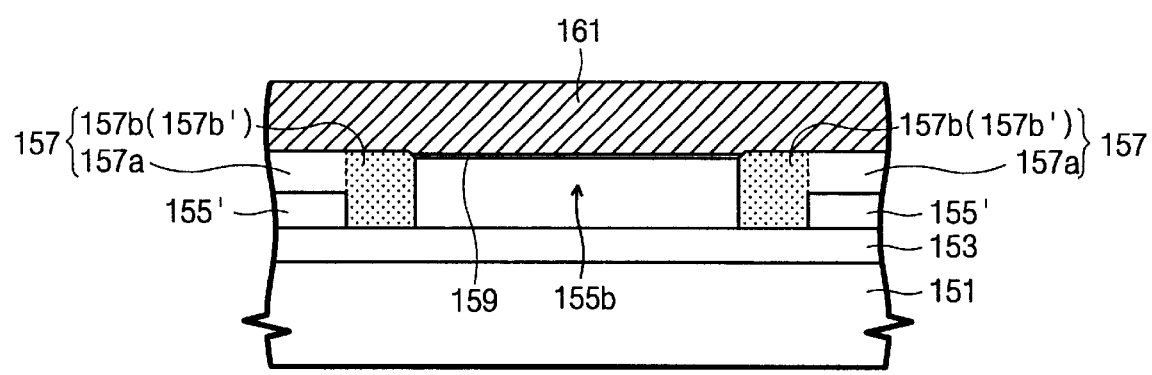

Referring to FIGS. 18A and 18B, the first trench mask pattern MK1 is removed to expose the body contact active region 155a and the transistor active region 155b. A gate dielectric layer 159 is formed on the exposed body contact active region 155a and the exposed transistor active region 155b. A conductive layer 161 is formed on an entire surface of the resultant structure having the gate dielectric layer 159.

Figure 19A:
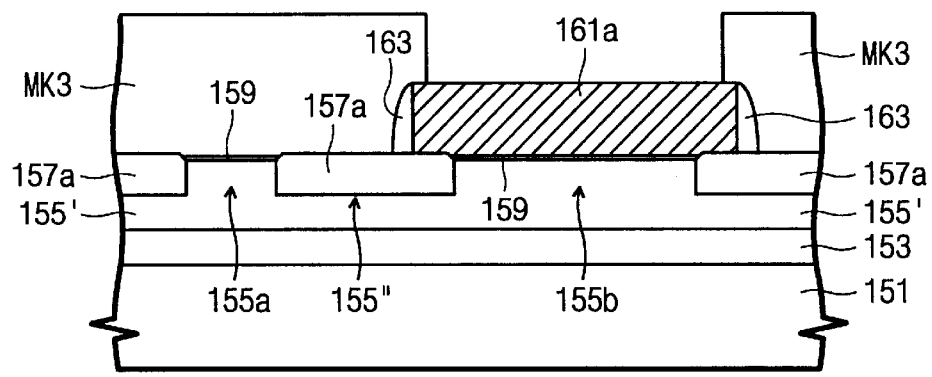
Figure 19B:
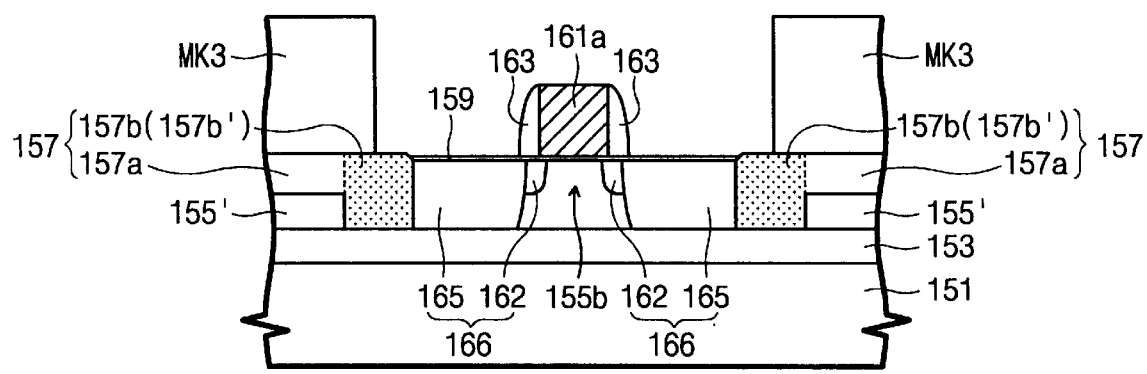

Referring to FIGS. 19A and 19B, the conductive layer 161 is patterned to form an insulated gate pattern 161a crossing over the transistor active region 155b. Both ends of the insulated gate pattern 161a are overlapped with the partial trench isolation layer 157a on the body extension 155". In addition, the insulated gate pattern 161a may be overlapped with the ends of the full trench isolation layer 157b' as shown in FIG. 12. Impurities of a second conductivity type are then implanted into the transistor active region 155b at a low dose of $1\times10^{12}$ ion atoms/cm$^2$ to $1\times10^{14}$ ion atoms/cm$^2$ using the insulated gate pattern 161a as an implantation mask. As a result, lightly doped regions 162 of the second conductivity type are formed at both sides of the gate pattern 161a. Subsequently, a spacer 163 is formed on the sidewall of the gate pattern 161a.

A source/drain implantation mask MK3 is formed on the substrate having the spacer 163. The source/drain implantation mask MK3 has an opening that exposes the transistor active region 155b. Preferably, the edge of the opening is located on the full trench isolation layer 157b (157b') as shown in FIG. 19B. Impurities of the second conductivity type are implanted into the lightly doped regions 162 at a high dose of $1\times10^{14}$ ion atoms/cm$^2$ to $5\times10^{15}$ ion atoms/cm$^2$ using the insulated gate pattern 161a, the spacer 163 and the source/drain implantation mask MK3 as implantation masks. As a result, heavily doped regions 165 of the second conductivity type are formed at both sides of the gate pattern 161a. The lightly doped region 162 and the heavily doped region 165 constitute a lightly doped drain (LDD) shaped source/drain region 166. The bottom of the source/drain regions 166 are in contact with the buried insulating layer 153. Also, most (all) of the sidewalls of the source/drain regions 166 are in contact with the full trench isolation layer 157b (157b'). Thus, source/drain junction capacitance is remarkably reduced.

Figure 20A:
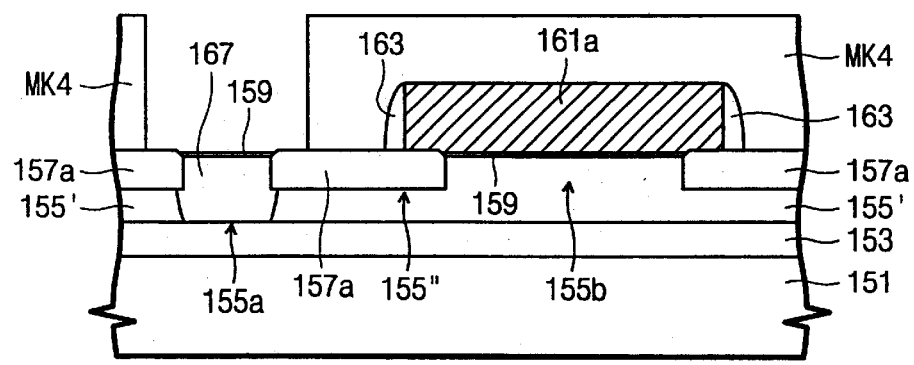
Figure 20B:
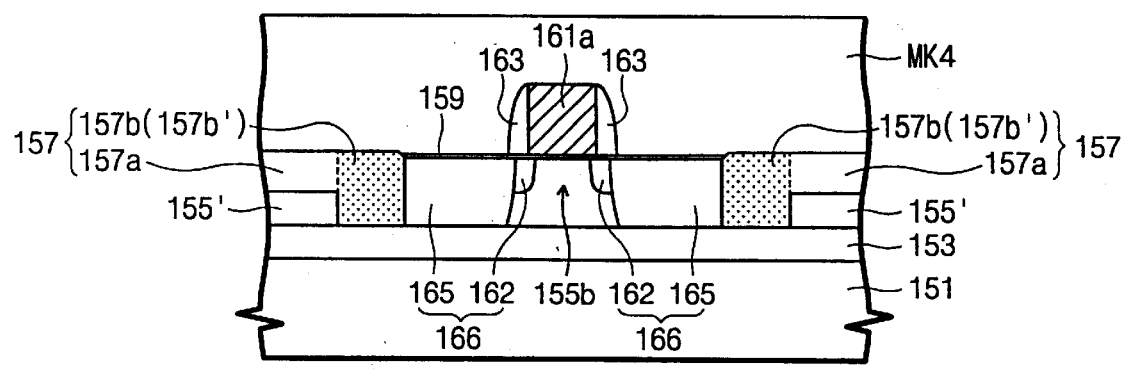

Referring to FIGS. 20A and 20B, the source/drain implantation mask MK3 is removed. A well contact implantation mask MK4 is formed on the resultant structure where the source/drain implantation mask MK3 is removed. The well contact implantation mask MK4 exposes the body contact active region 155a. Impurities of the first conductivity type are implanted into the body contact active region 155a using the well contact implantation mask MK4 as an implantation mask. As a result, a well contact region 167 of the first conductivity type is formed in the body contact active region 155a. Accordingly, the well contact region 167 is electrically connected to the transistor active region (i.e. body region) between the source/drain regions 166 through the semiconductor residue layer 155' and the body extension 155".

As described above, the present invention can prevent the body region of the SOI MOSFET from being electrically floated. Therefore, it can be used to realize reliable and compact SOI integrated circuits.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. A silicon-on-insulator (SOI) semiconductor integrated circuit formed on an SOI substrate including a supporting substrate, a buried insulating layer on the supporting substrate and a semiconductor layer of a first conductivity type on the buried insulating layer, the integrated circuit comprising:

a transistor active region comprising a predetermined region of the semiconductor layer;

at least one body contact active region spaced apart from the transistor active region, the body contact active region including a portion of the semiconductor layer;

a semiconductor residue layer disposed over the entire surface of the buried insulating layer between the transistor active region and the body contact active region, the semiconductor residue layer being thinner than the semiconductor layer;

a partial trench isolation layer surrounding upper sidewalls of the transistor active region and the body contact active region, the partial trench isolation layer being disposed on the semiconductor residue layer;

a full trench isolation layer interposed between the partial trench isolation layer and the transistor active region, the full trench isolation layer being in contact with the buried insulating layer;

a body extension of the first conductivity type extended from a predetermined sidewall of the semiconductor residue layer toward the transistor active region, the body extension electrically connecting the transistor active region to the semiconductor residue layer and being covered with the partial trench isolation layer; and an insulated gate pattern crossing over the transistor active region, the insulated gate pattern being overlapped with the body extension.

2. The silicon-on-insulator (SOI) semiconductor integrated circuit of claim 1, wherein the first conductivity type is one of P-type and N-type.

3. The silicon-on-insulator (SOI) semiconductor integrated circuit of claim 1, wherein the semiconductor layer is a silicon layer.

4. The silicon-on-insulator (SOI) semiconductor integrated circuit of claim 1, wherein the full trench isolation layer comprises a first full trench isolation layer and a second full trench isolation layer, which are separated each other.

5. The silicon-on-insulator (SOI) semiconductor integrated circuit of claim 4, wherein the first and second full trench isolation layers are symmetrical to the insulated gate pattern each other.

6. The silicon-on-insulator (SOT) semiconductor integrated circuit of claim 1, further comprises source/drain regions formed at the transistor active regions, which are located at both sides of the insulated gate pattern, the source/drain regions having a second conductivity type opposite to the first conductivity type and being in contact with the buried insulating layer.

7. The silicon-on-insulator (SOI) semiconductor integrated circuit of claim 6, wherein the full trench isolation layer surrounds the source/drain regions.

8. The silicon-on-insulator (SOT) semiconductor integrated circuit of claim 1, further comprises a well contact region formed at the body contact active region, the well contact region having the first conductivity type.

* * * * *

UNITED STATES PATENT AND TRADEMARK OFFICE
CERTIFICATE OF CORRECTION

PATENT NO.    : 6,521,959 B2
DATED         : February 18, 2003
INVENTOR(S)   : Young-Wug Kim et al.

It is certified that error appears in the above-identified patent and that said Letters Patent is hereby corrected as shown below:

<u>Column 14,</u>
Lines 51 and 61, please replace "SOT" with -- SOI --.

Signed and Sealed this

Twelfth Day of August, 2003

JAMES E. ROGAN
*Director of the United States Patent and Trademark Office*